(12) United States Patent
Hoff et al.

(10) Patent No.: US 9,378,789 B2
(45) Date of Patent: Jun. 28, 2016

(54) VOLTAGE LEVEL SHIFTED SELF-CLOCKED WRITE ASSISTANCE

(71) Applicant: QUALCOMM Incorporated, San Diego, CA (US)

(72) Inventors: David Paul Hoff, Raleigh, NC (US); Amey Kulkarni, Raleigh, NC (US); Jason Philip Martzloff, Chapel Hill, NC (US); Stephen Edward Liles, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/499,035

(22) Filed: Sep. 26, 2014

(65) Prior Publication Data
US 2016/0093346 A1    Mar. 31, 2016

(51) Int. Cl.
*G11C 7/12*    (2006.01)
*H03K 3/356*    (2006.01)

(52) U.S. Cl.
CPC ............ *G11C 7/12* (2013.01); *H03K 3/356104* (2013.01)

(58) Field of Classification Search
CPC .... G11C 7/1096; G11C 11/4096; G11C 7/12; H03K 3/356104
See application file for complete search history.

(56) References Cited

U.S. PATENT DOCUMENTS

| | | | |
|---|---|---|---|
| 4,380,080 A | 4/1983 | Rattlingourd | |
| 5,144,162 A * | 9/1992 | Tran | H03K 19/01728 326/17 |
| 5,202,855 A | 4/1993 | Morton | |
| 5,506,522 A * | 4/1996 | Lee | G11C 7/1051 326/58 |
| 5,550,488 A | 8/1996 | Fifield et al. | |
| 5,729,160 A | 3/1998 | Allan | |
| 5,767,716 A | 6/1998 | Ko | |
| 5,809,528 A | 9/1998 | Miller et al. | |
| 5,933,386 A | 8/1999 | Walker et al. | |
| 6,249,145 B1 * | 6/2001 | Tanaka | H03K 3/356104 326/62 |

(Continued)

FOREIGN PATENT DOCUMENTS

JP    S566525 A    1/1981

OTHER PUBLICATIONS

Taufique M.N., et al., "A 512-KB Level-2 Cache Design in 45-nm for Low Power IA Processor Silverthorne," IEEE 2008 Custom Intergrated Circuits Conference (CICC), Intel Corporation, Sep. 2008, pp. 403-406.

(Continued)

*Primary Examiner* — Khamdan Alrobaie
(74) *Attorney, Agent, or Firm* — Muncy, Geissler, Olds & Lowe, P.C.

(57) ABSTRACT

Systems and methods for generating voltage level shifted self-clocked write assistance include a circuit with self-clocked true and complement data input signals in a first voltage domain. First and second full voltage level shifters are configured to generate voltage level shifted self-clocked intermediate true and complement signals in a second voltage domain, based on the self-clocked true and complement data input signals in the first voltage domain. Tristating logic including first and second complementary metal oxide semiconductor (CMOS) circuits are configured to generate voltage level shifted self-clocked tristated true and complement output signals used for providing write assistance for a memory array in the second voltage domain, based on the voltage level shifted self-clocked intermediate true and complements signals.

19 Claims, 6 Drawing Sheets

(56) References Cited

U.S. PATENT DOCUMENTS

| | | |
|---|---|---|
| 6,292,403 B1 | 9/2001 | Pancholy et al. |
| 6,483,363 B1 | 11/2002 | Karnik et al. |
| 6,504,421 B2 | 1/2003 | Blodgett et al. |
| 7,958,418 B2 | 6/2011 | Pacha et al. |
| 8,120,968 B2 | 2/2012 | Reohr et al. |
| 8,188,780 B2 | 5/2012 | Pacha et al. |
| 2010/0177578 A1* | 7/2010 | King .................. G11C 7/105 365/194 |
| 2013/0308399 A1 | 11/2013 | Kohli |
| 2014/0254293 A1 | 9/2014 | Desai et al. |
| 2014/0269112 A1 | 9/2014 | Jung et al. |

OTHER PUBLICATIONS

International Search Report and Written Opinion—PCT/US2015/049220—ISA/EPO—Nov. 26, 2015.

* cited by examiner

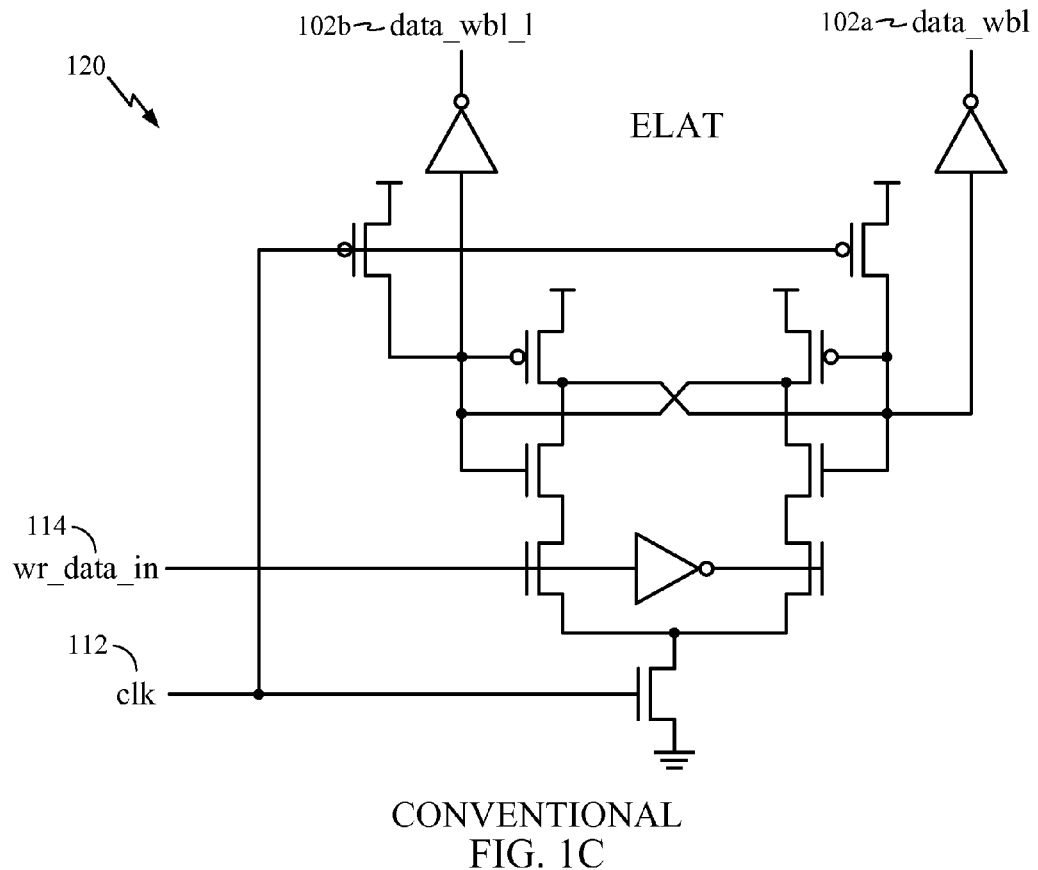
CONVENTIONAL
FIG. 1C
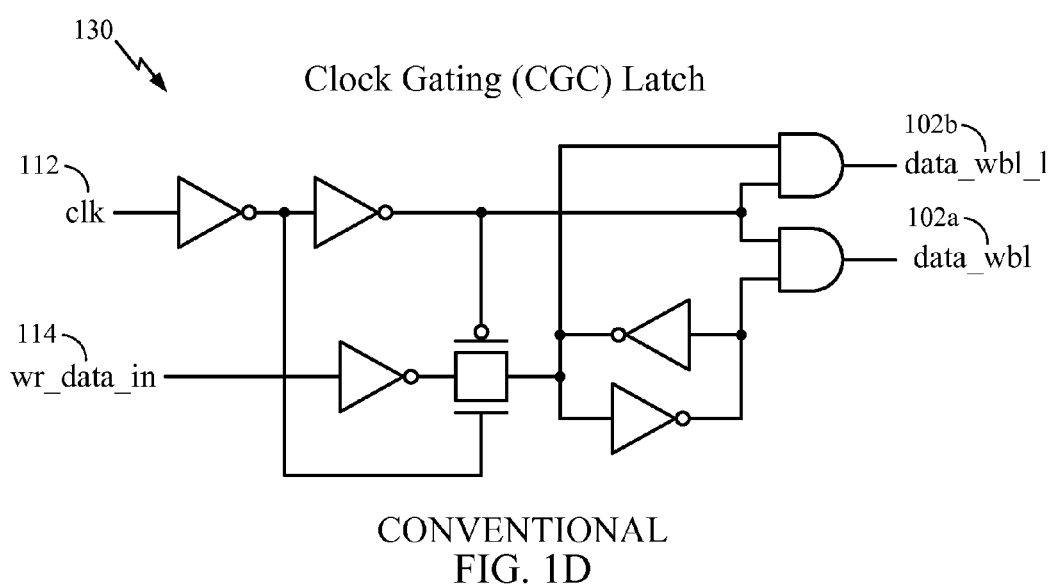
CONVENTIONAL
FIG. 1D

Self-Clocked Level-Shifted Write Assist for Voltage Island Array

VOLTAGE LEVEL SHIFTED SELF-CLOCKED WRITE ASSISTANCE

FIELD OF DISCLOSURE

Disclosed aspects are directed to self-clocked write drivers configured for writeability and elimination of internal setup and hold time requirements thereof. More specifically, exemplary aspects are directed to voltage level shifted self-clocked tristated write bitline drivers and related circuitry for providing write assistance to memory arrays which include voltage islands.

BACKGROUND

Computer processing systems use several kinds of memory structures based on technologies such as dynamic random access memory (DRAM), static random access memory (SRAM), magnetoresistive random access memory (MRAM), etc. These memory structures are conventionally designed as memory arrays comprising memory cells or bit cells. Specialized write circuitry may be required for writing data to be stored in the bit cells of the memory arrays to suit individual needs of the memory arrays.

In one example, for an SRAM array comprising an array of bit cells, true and complement write bitlines may be used for writing the bit cells. A local write driver circuit may be employed for effectively driving the write bitlines in order to write the bit cells during a write operation. However, since reducing power consumption is an important consideration in many processing systems, the write driver circuitry may also be configured to float the write bitlines when a write operation is not being performed, in order to reduce leakage power.

Conventional write driver circuits may use tri-state drivers gated by an enable clock in order to achieve the above functions of driving or floating true and complement versions of the write bitlines. However, such conventional write drivers may be prone to several problems. Controlling setup and hold times for the write bit lines driven by tri-state drivers tends may be difficult. This is because race conditions may arise during the operation of the tri-state drivers. A back-end self-timed race condition pertains to a requirement for data driven on the true and complement write bitlines to hold past a falling edge of the write clock used for the write operation. This back-end self-timed race condition may arise in the case of edge-triggered designs as well as transparent latch designs. In the case of an edge-triggered interface design, where the data inputs return to zero (RTZ) during a low phase of a system clock, these data inputs need to hold past the falling edge of the write clock. If the data inputs do not hold past the falling edge of the write clock, a critical internal race margin may be violated and incorrect values may be written to the bit cells. Further, the data inputs need to meet setup margins with relation to the write clock in order to prevent glitches on the write bitlines. Failing to meet the setup margins may lead to errors and loss of dynamic power resulting from unnecessary switching of static write bitlines.

Further, the conventional tri-state drivers use stacked transistors (e.g., n-channel metal oxide semiconductor (NMOS) and p-channel metal oxide semiconductor (PMOS) gates) for their operation in driving and floating the bitlines. These stacked structures affect writability at low supply voltages and require larger sizing for required drive strength, thus incurring costs in terms of area and dynamic power.

Another problem in conventional write driver circuits relates to voltage scaling. The write drivers may need to translate signals from one voltage domain to another. For example, the memory array may belong to a first voltage domain, which may be a low voltage domain to reduce power consumption of the memory array. The true and complement write bitlines may carry data supplied from a second voltage domain, which may be a higher voltage domain in order to meet requirements for writeability of bit cells. For example, the minimum voltage required to be able to write SRAM bit cells may be high, which would require driving a higher voltage on the write bitlines.

Utilizing a single level shifter in write bitline drivers for shifting the true and complement write bitlines from the second voltage domain to the first voltage domain may be problematic. When no active write is performed, i.e., when the true and complement write bitlines are in a low phase or when both carry a zero binary value, the single level shifter may drive the write driver circuit into an unknown state, which may be difficult to recover from.

Conventional write bitline drivers which include a single level shifter may accept non-RTZ data input signals. The output of the level shifter output is then merged with a level shifted write clock at the write bitline driver. For such conventional designs, the level shifter must provide a balanced delay for both rising and falling data inputs, which poses significant design challenges.

Accordingly, there is a need to avoid the aforementioned drawbacks associated with conventional implementations of level shifters pertaining, for example, to memory array write bitline drivers.

SUMMARY

Exemplary aspects include systems and methods related to voltage level shifted self-clocked tristated write bitline drivers.

For example, an exemplary aspect is directed to an apparatus comprising first and second full voltage level shifters are configured to receive self-clocked true and complement data input signals in a first voltage domain and generate voltage level shifted self-clocked intermediate true and complement signals in a second voltage domain, based on the self-clocked true and complement data input signals in the first voltage domain. First and second complementary metal oxide semiconductor (CMOS) circuits are configured to generate voltage level shifted self-clocked tristated true and complement output signals in the second voltage domain based on the voltage level shifted self-clocked intermediate true and complements signals.

Another exemplary aspect is directed to a method of operating a circuit, the method comprising: inputting self-clocked true and complement data input signals to the circuit in a first voltage domain, generating voltage level shifted self-clocked intermediate true and complement signals in a second voltage domain from the self-clocked true and complement data input signals in the first voltage domain, using first and second full voltage level shifters, and generating voltage level shifted self-clocked tristated true and complement output signals in the second voltage domain from the voltage level shifted self-clocked intermediate true and complements signals, using first and second complementary metal oxide semiconductor (CMOS) circuits.

Another exemplary aspect is directed to a system comprising first means for voltage level shifting and second means for voltage level shifting for receiving self-clocked true and complement data input signals in a first voltage domain and generating voltage level shifted self-clocked intermediate true and complement signals in a second voltage domain from the self-clocked true and complement data input signals in the first voltage domain, and means for tristating for generating voltage level shifted self-clocked tristated true and complement output signals in the second voltage domain from the voltage level shifted self-clocked intermediate true and complements signals.

Accordingly, in exemplary aspects, based on the two level shifters used to level shift the true and complement data inputs from the first voltage domain to the second voltage domain, only one edge of the data input signals (e.g., the rising edge of the true data input signal/falling edge of the complement data input signal) is critical for timing and generation of output signals in the exemplary circuit. The other edge (e.g., the falling edge of the true data input signal/rising edge of the complement data input signal in the above example) may be used used to float write bitlines which may be driven by the circuit for writing memory bit cells. Thus, the other edge of the data input signals is not timing critical. Further, in exemplary aspects, the two level shifters may be clamped using a clamping signal derived at the second voltage domain, which can prevent crow-bar current in the level shifters, and can be used to float the write bitline drivers during power supply ramp-up and collapse phases.

BRIEF DESCRIPTION OF THE DRAWINGS

The accompanying drawings are presented to aid in the description of embodiments of the invention and are provided solely for illustration of the embodiments and not limitation thereof.

FIG. 1C illustrates a conventional entry latch (ELAT) for generating true and the complement phase-clocks.

FIG. 1D illustrates a conventional clock gating (CGC) latch for generating true and the complement phase-clocks.

DETAILED DESCRIPTION

Figure 1A:
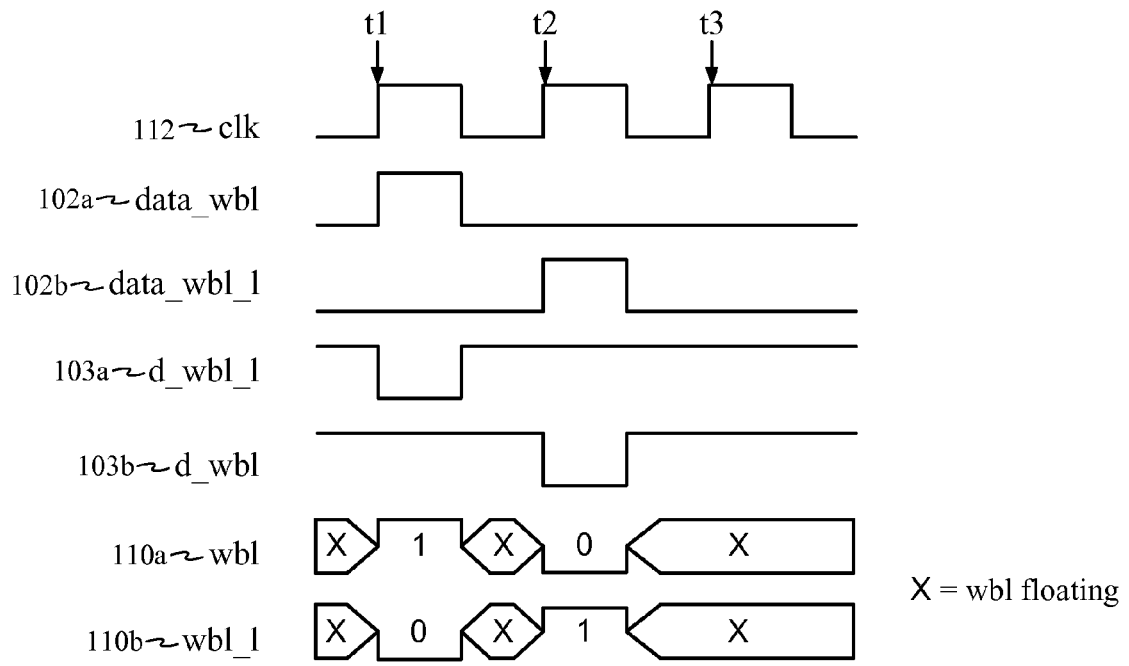
FIGS. 1A-B illustrate a timing diagram and a circuit diagram, respectively, for a self-clocked write bitline driver according to an aspect of this disclosure.

Aspects of the invention are disclosed in the following description and related drawings directed to specific embodiments of the invention. Alternative embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects are directed to write driver circuits which avoid the aforementioned problems of the conventional write drivers for memory arrays. For example, a self-clocked write bitline driver is disclosed, wherein "self-clocking" is achieved by using data inputs to gate tri-state circuits in the write bitline driver, thereby eliminating the write enable clock discussed previously. Correspondingly, the problems associated with race conditions, power consumption, design complexity, etc., which were characteristic of the conventional write drivers which relied on the write enable clock are also overcome. More particularly, in an exemplary self-clocked write bitline driver, setup and hold margins associated with conventional write drivers are managed by the self-clocked nature of the write data bitlines. The self-clocked write driver can also float the write bitlines when a write operation is not in progress. In this manner, leakage power can be reduced. As will be further explained, writability at low voltages can be achieved by the use of a single NMOS transistor for pull-down of the write bitlines to write a value of zero, as opposed to two stacked pull-down devices required in conventional write drivers.

Moreover, in exemplary aspects, rather than utilize a single level shifter for both the true and complement write bitlines, separate level shifters may be provided to the exemplary self-clocked write bitline driver, one each for level shifting the true and the complement write bitlines. The two level shifters may be used to level shift the true and complement data inputs from a first voltage domain to a second voltage domain. More particularly, only one edge of the data input signals (e.g., the rising edge of the true data input signal/ falling edge of the complement data input signal) is critical for timing and generation of output signals in the exemplary self-clocked write bitline driver. The other edge (e.g., the falling edge of the true data input signal/rising edge of the complement data input signal in the above example) is used to float the write bitlines as noted above, and thus, the other edge of the data input signals is not timing critical. In contrast, for conventional level shifters which involve a single level shifter tend to be unbalanced in delay for propagating a data value of "1" and a data value of "0," for example.

The two level shifters may be clamped using a clamping signal derived at the second voltage domain, which can prevent crow-bar current in the level shifters, and can be used to float the self-clocked write bitline drivers during power supply ramp-up and collapse phases. The outputs of the self-clocked write bitline drivers may be provided by tristate circuits, which allow them to be at binary values of "0" or "1," as well as the floating state as described above for power supply ramp-up and collapse phases, for example. In conventional designs, timing skews may arise due to the voltage variation between the first and second voltage domains. In exemplary aspects, the self-clocked approach may avoid interfacing data inputs at the first clock domain with a level shifted clock, thereby avoiding timing skew issues.

Figure 1B:
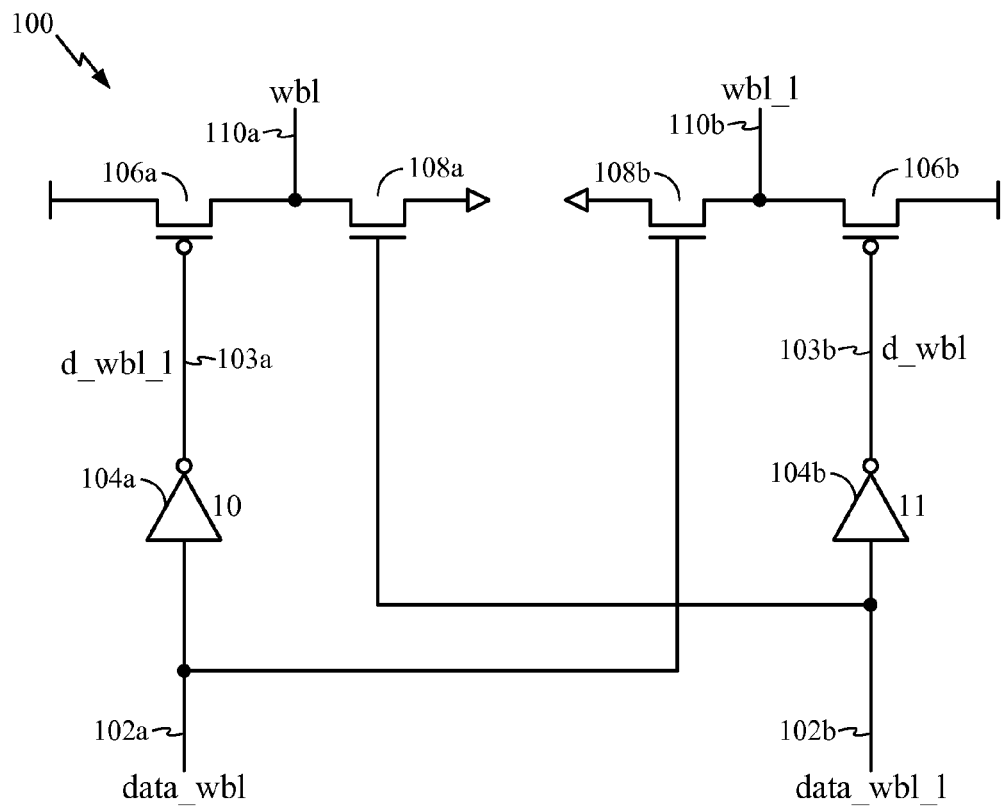

With reference now to FIGS. 1A-B, an exemplary self-clocked write bitline driver 100 and timing diagrams for associated signals thereof will be described. Referring to FIG. 1B, the data inputs to self-clocked write bitline driver 100 are self-clocked data signals represented as true and complement phase-clocks, data_wbl 102a and data_wbl_l 102b. These true and complement phase-clocks, data_wbl 102a and data_wbl_l 102b can be generated by an input interface such as an entry latch (ELAT) or differential clock-gating latch, which are further described in FIGS. 1C-D. The true and complement phase-clocks, data_wbl 102a and data_wbl_l 102b can pass through inverters 104a and 104b respectively to generate inverted true and complement data input signals d_wbl_l 103a and d_wbl 103b to self-clocked write bitline driver 100. The self-clocked write bitline driver 100 comprises a first complementary MOS (CMOS) structure including PMOS 106a and NMOS 108a, and a second CMOS structure comprising PMOS 106b and NMOS 108b. As shown in FIG. 1B, data_wbl 102a is connected to the gate of NMOS 108b and data_wbl_l 102b is connected to the gate of NMOS 108a. The corresponding inverted signals are connected to the PMOS gates, such that d_wbl 103b is connected to the gate of PMOS 106b and d_wbl_l 103a is connected to the gate of PMOS 106a. The outputs of the self-clocked write bitline driver 100 are available from the outputs of the two CMOS structures, as wbl 110a and wbl_l 110b.

With reference to FIG. 1A the timing diagrams for the signals of self-clocked write bitline driver 100 are provided. Clock 112 is a system clock. In this illustration, no active writes are shown during the low phase of clock 112. In the first cycle, starting from the left, a low phase of clock 112 is shown. During the low phase of clock 112, outputs write bitlines wbl 110a and wbl_w 110b are not driven, or are floated, since both the true and the complement phase-clocks data_wbl 102a and data_wbl_l 102b, are at a low phase or binary value "0," thus turning off NMOS 108a, 108b, as well as PMOS 106a, 106b.

In the next cycle, clock 112 transitions to high or an active phase at time t1. During this active phase, a write operation is active. Thus, one of the true and the complement phase-clocks data_wbl 102a and data_wbl_l 102b inputs will switch high while the other remains low or at zero. Specifically, at time t1, phase-clock data_wbl 102a will switch high while data_wbl_l 102b remains low. Similarly, at time t2, when clock 112 transitions to high again, phase-clock data_wbl 102a will be low while data_wbl_l 102b switches high. Correspondingly, at times t1 and t2, one of the inverted signals d_wbl_l 103a and d_wbl 103b will switch low while the other remains high. As shown, for time t1, data_wbl 102a switches high or to "1," which enables NMOS 108b to be switched on, and thus pulling output wbl_l 110b low or to "0." The corresponding inverted signal d_wbl_l 103a switches low to turn on PMOS 106a, which drives output wbl 110a high. Since data_wbl_l 102b remains at zero during this clock cycle, PMOS 106b and NMOS 108a remain off, thus eliminating any contention or glitches in the outputs wbl 110a and wbl_l 110b. Similarly, at time t2, output wbl 110a is driven low and output wbl_l 110b is driven high. Corresponding data can be written to a bit cell (not shown) connected to self-clocked write bitline driver 100 using true and complement outputs wbl 110a and wbl_l 110b, available at times t1 and t2, which are glitch free and devoid of other problems associated with conventional write driver outputs.

Transitioning to the next cycle of clock 112, at time t3, the back-end of the write operations described above is shown. During the back-end of the write operation, PMOS 106b and NMOS 108a remain off, and when the true and the complement phase-clocks data_wbl 102a and data_wbl_l 102b return to zero, PMOS 106a and NMOS 108b are turned off, thereby transitioning the CMOS structures to a tri-state mode. Thus, contention will continue to be prevented in this tri-state mode, which acts as a self-clocking scheme for floating the true and complement outputs wbl 110a and wbl_l 110b, while eliminating the need for merging an extra clock to the self-clocked write bitline driver 100.

Referring now to FIG. 1C, ELAT 120 which may be used to generate the true and the complement phase-clocks data_wbl 102a and data_wbl_l 102b of FIGS. 1A and 1B is illustrated. The operation of ELAT 120 may be according to well-known implementations of entry latch structures as will be understood by one skilled in the art, and thus, an exhaustive explanation of the structure and working of ELAT 120 will be avoided. As shown, the data value to be written to a bit cell using self-clocked write bitline driver 100 can be provided on data input signal wr_data_in 114. System clock 112 is another input to ELAT 120. Based on the illustrated circuit structure, ELAT 120 can generate the self-clocked true and the complement phase-clocks data_wbl 102a and data_wbl_l 102b which are input to self-clocked write bitline driver 100 of FIG. 1B.

Referring now to FIG. 1D, clock gating (CGC) latch 130 which may alternatively be used to generate the true and the complement phase-clocks data_wbl 102a and data_wbl_l 102b of FIGS. 1A and 1B is illustrated. The operation of CGC latch 130 may also be according to well-known implementations of CGC latch structures as will be understood by one skilled in the art, and thus, an exhaustive explanation of the structure and working of CGC latch 130 will be avoided. As shown, the data value to be written to a bit cell using self-clocked write bitline driver 100 can be provided on data input signal wr_data_in 114. System clock 112 is another input to CGC latch 130. Based on the illustrated circuit structure, CGC latch 130 can generate the self-clocked true and the complement phase-clocks data_wbl 102a and data_wbl_l 102b which are input to self-clocked write bitline driver 100 of FIG. 1B.

Figure 2A:
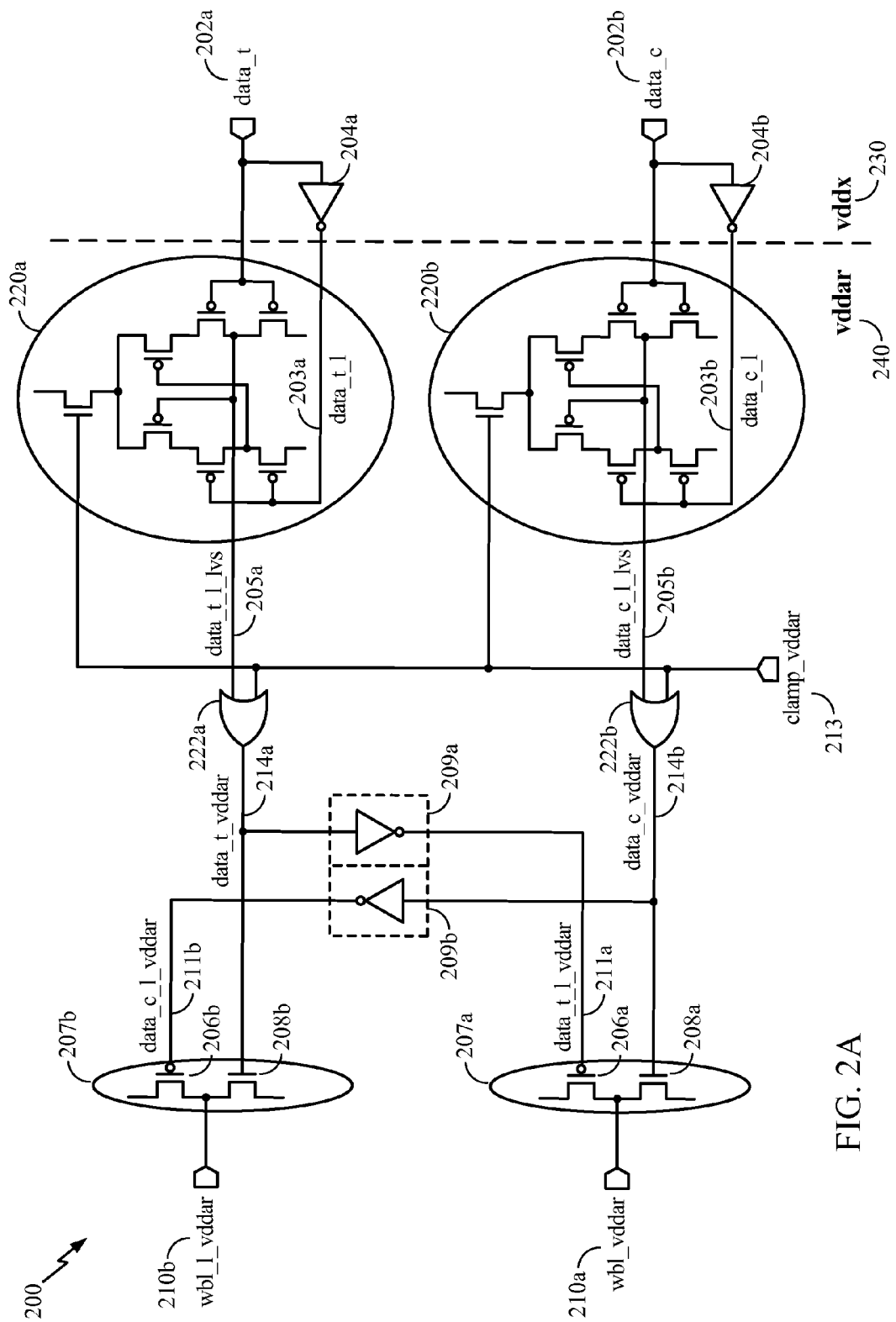
FIG. 2A illustrates a level shifting circuit for a self-clocked write bitline driver according to an aspect of this disclosure.
Figure 2B:
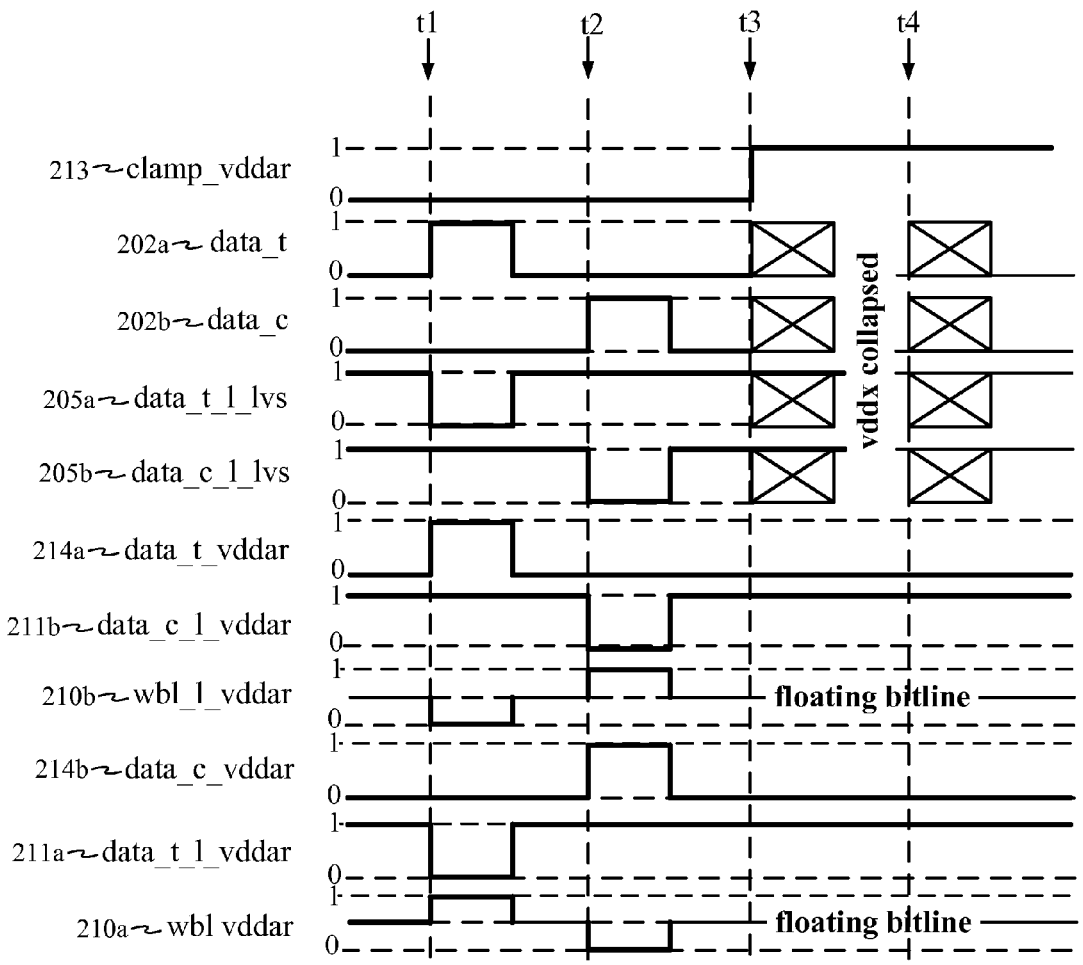
FIG. 2B illustrates a timing diagram for signals of the circuit of FIG. 2A.

Referring now to FIGS. 2A-B, another aspect of self-clocked drivers according to this disclosure is illustrated. At the outset it is noted that FIG. 2A illustrates circuit 200 for efficient voltage shifting of differential signals between voltage domains, as applied to an exemplary case for self-clocked write bitline drivers described previously. However, it will be understood that the application and scope of circuit 200 are not so limited, but can be extended to any voltage shifting circuitry for shifting differential signals (i.e., signals presented in a true and complement form) from a first voltage domain to a second voltage domain. Circuit 200 can be used for avoiding skew issues and impacts of supply voltage variations across voltage domains for differential signals, particularly, for differential signals which are of a self-clocked nature or of a return-to-zero (RTZ) type. In contrast to aforementioned conventional methods, exemplary circuit 200 can involve two level shifters, one each for the true and the complement signals of the differential signals, which eliminates the aforementioned issues with conventional voltage shifting. Additional aspects and features of circuit 200 will now be described with regard to the example of shifting true and complement differential signals, data_t 202a and data_c 202b (which may be similar to true and complement phase-clocks, data_wbl 102a and data_wbl_l 102b of FIG. 1B when applied in the context of write bitline drivers).

Accordingly, with reference to FIG. 2A, circuit 200 represents a schematic circuit diagram for a voltage shifting circuit for shifting differential signals between two voltage domains representatively shown as vddx 230 and vddar 240. In the context of write driver circuitry for writing bit cells of a memory array (not shown), circuit 200 accepts differential signal inputs from the first voltage domain vddx 230, and converts them to differential signal outputs in the second voltage domain vddar 240. The second voltage domain vddar 240 may be a voltage island which has a voltage supply corresponding to the voltage supply to the memory array. Thus, circuit 200 may provide write assistance to the write bitline drivers operating on a memory array contained within the voltage island. Without restriction, the first and second voltage domain may have different voltage supplies or different levels of supply voltages, where a first supply voltage of the first voltage domain may be less than or greater than a second supply voltage of the second voltage domain.

Similar to the inputs data_wbl 102a and data_wbl_l 102b to self-clocked write bitline driver 100 of FIG. 1B, self-clocked true and complement data input signals, data_t 202a and data_c 202b, are input to circuit 200 at the first voltage domain vddx 230. These data input signals pass through inverters 204a and 204b situated within the first voltage domain vddx 230, and generate the corresponding inverted signals data_t_l 203a and data_c_l 203b respectively. The two pairs of data input signals and corresponding inverted signals, i.e., data_t 202a, data_t_l 203a and data_c 202b, data_c_l 203b are input to two parallel and separate full voltage level shifters 220a and 220b respectively in the second voltage domain vddar 240. Significantly, first and second full voltage level shifters 220a and 220b are used as above, in contrast to a conventional single voltage shifter. This avoids skew issues with supply variation across the two voltage domains because the data input signals are self-clocked (e.g., based on ELAT 120 or CGC latch 130 as in FIGS. 1C-D). The two voltage level shifters 220a and 220b are configured to shift signals from the first voltage domain vddx 230 to the second voltage domain vddar 240. A detailed operation and functionality of the voltage level shifters 220a and 220b will be avoided herein as they may be designed according to conventional approaches which will be known by one skilled in the art.

Accordingly, the two full level shifters 220a and 220b provide voltage level shifted self-clocked intermediate signals data_t_l_lvs 205a and data_c_l_lvs 205b in the second voltage domain vddar 240, corresponding to the inverted differential signals data_t_l 203a and data_c_l 203b in the first voltage domain vddx 230. In some aspects, circuit 200 may further employ the clamp signal, clamp_vddar 213 in the second voltage domain vddar 240 (e.g., coupled to PMOS head switches in the full level shifters 220a and 220b) in order to prevent crow-bar current. The clamp signal clamp_vddar 213 may be active high or active low depending on specific implementations and operates to prevent unwanted crow-bar or short circuit current from being generated when the first voltage supply to the first voltage domain vddx 230 is collapsed (e.g., for power saving when no write operation is in progress). Further, clamp_vddar 213 is also coupled with voltage level shifted outputs data_t_l_lvs 205a and data_c_l_lvs 205b of the full level shifters 220a and 220b by means of NOR gates 222a and 222b respectively, which ensures that output write bitline signals of circuit 200, wbl_l_vddar 210b and wbl_vddar 210a, are floating on the active second voltage domain vddar 240 when the first voltage domain vddx 230 is collapsed. In this manner, the output write bitline signals wbl_l_vddar 210b and wbl_vddar 210a are "tristated" in order to allow their values to float when the first voltage domain vddx 230 is collapsed.

Outputs of NOR gates 222a and 222b, i.e., outputs of data_t_l_lvs 205a and data_c_l_lvs 205b of the full level shifters 220a and 220b clamped with clamp_vddar 213 are provided on signals data_t_vddar 214a and data_c_vddar 214b respectively. It will be recognized that signals data_t_vddar 214a and data_c_vddar 214b in the second voltage domain vddar 240 are derived from inputs data_wbl 102a and data_wbl_l 102b of self-clocked write bitline driver 100 of FIG. 1B, without use of an input clock signal. Thus, after voltage level shifting, the tristated output write bitline signals wbl_l_vddar 210b and wbl_vddar 210a are also self-clocked. Therefore, the output write bitline signals wbl_l_vddar 210b and wbl_vddar 210a may also be referred to herein as "voltage level shifted self-clocked tristated true and complement output signals" of circuit 200.

The true and complement phase signals data_t_vddar 214a and data_c_vddar 214b can pass through inverters 209a and 209b respectively to generate inverted true and complement signals data_t_l_vddar 211a and data_c_l_vddar 211b respectively, in the second voltage domain vddar 240. Circuit 200 also comprises a CMOS circuit 207a comprising PMOS 206a and NMOS 208a, and another CMOS circuit 207b comprising PMOS 206b and NMOS 208b, which provide tristating logic for tristating outputs of circuit 200. As shown in the figure, data_t_vddar 214a is connected to the gate of NMOS 208b and data_c_vddar 214b is connected to the gate of NMOS 208a. The corresponding inverted signals are connected to the PMOS gates, such that data_c_l_vddar 211b is connected to the gate of PMOS 206b and data_t_l_vddar 211a is connected to the gate of PMOS 206a. The outputs of the circuit 200 are available from the outputs of the two CMOS circuits 207a and 207b, as the tristated self-clocked level shifted differential signals wbl_l_vaddr 210b and wbl_vaddr 210a, as shown. These level shifted differential output signals of circuit 200 may be used to write bit cells of a memory array (not shown), with write assistance derived from the level shifting to the second voltage domain vddar 240.

With reference now to FIG. 2B, a timing diagram pertaining to the above-described signals of circuit 200 of FIG. 2A are illustrated. Time instances t1, t2, t3, and t4 mark the start of successive clock periods of a system clock used in the self-clocking of the signals illustrated. Signals in FIG. 2A are shown to be of high or logic level "1," logic low or logic level "0," or floating or at an unknown (X) value between these two levels.

At time instances t1 and t2, a low phase of the clamp signal clamp_vaddr 213 is illustrated, wherein the true part of the differential data input signals. Data input signal data_t 202a is switched high or to logic level "1" at the first instance t1. The complement data input signal data_c 202b remains low or "0" at time t1. Correspondingly, the inverted signals dta_t_l_lvs 205a and data_c_l_lvs 205b are driven to "0" and "1," in the second voltage domain vdd_ar 240. The signals data_t_vddar 214a and data_c_l_vddar 211b are thus driven to "1" and "1" in the second voltage domain vdd_ar 240 at time t1. This causes the output signal wbl_l_vddar 210b to be driven to "0." Correspondingly, data_c_vddar 214b and data_t_l_vddar 211a being at "0" and "0" values, respectively, causes output signal wbl_vddar 210a to be driven to "1." Accordingly, it is seen that the output signals of circuit 200 are based on a first edge (e.g., the rising edge of the true data input signal data_t 202a) at time t1, which makes the first edge timing critical for the output signals.

At time instance t2, the complement data input signal data_c is switched to and "1" (while the true data input signal data_t remains "0" and clamp signal clamp_vddar 213 remains low). This produces the opposite switching in the above-described signals, leading to outputs wbl_l_vddar 210b and wbl_vddar 210a being driven to "1" and "0" respectively.

Time instances t3 and t4 represent a phase where the first voltage domain vddr 230 is collapsed (e.g., when no write operation is being performed), which drives true and complement data input signals data_t 202a and data_c 202b to be driven to unknown states "X." During clock periods starting at time instances t3 and t4, clamp signal clamp_vddar 213 is driven high, which protects the signals in the second voltage domain vddar 240 from crow-bar currents, race conditions, short circuits, etc. Thus, stable signals data_t_vddar 214a and data_c_vddar 214b are driven to "0" due to the outputs of NOR gates 222a and 222b being driven to "0" as one input clamp_vddar 213 to NOR gates 222a and 222b is "1." Similarly, the inverted signals data_t_l_vddar 211a and data_c_l_vddar 211b are driven to "1," which turns off PMOS 206a and 206b. Correspondingly, CMOS circuits 207a and 207b are turned off, providing the requisite tristating logic or circuitry for floating the self-clocked output signals wbl_vddar 210a and wbl_l_vddar 210b. Since, output signals wbl_vddar 210a and wbl_l_vddar 210b are caused to float, the write bitlines that these signals may be used to drive are floated, thus conserving leakage power in the memory array.

Figure 3:
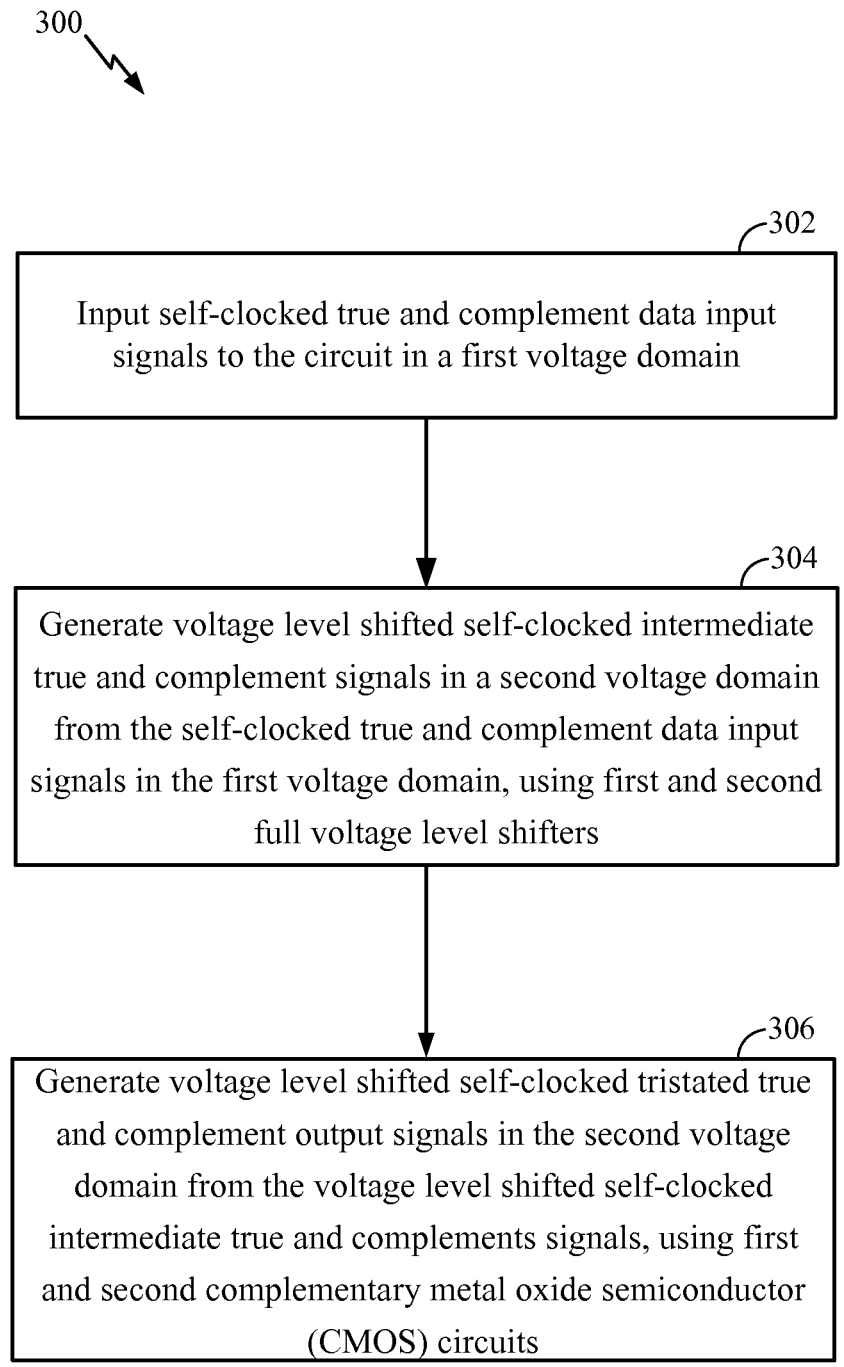
FIG. 3 is a flow-chart illustrating a method of operating a self-clocked write bitline driver circuit according to an aspect of this disclosure.

It will be appreciated that exemplary aspects include various methods for performing the processes, functions and/or algorithms disclosed herein. For example, as illustrated in FIG. 3, an exemplary aspect can include a method (300) of operating a circuit (e.g., circuit 200), the method comprising: inputting self-clocked differential input signals comprising self-clocked true and complement data input signals (e.g., data_t 202a and data_c 202b) to the circuit in a first voltage domain (e.g., vddx 230)—Block 302; generating voltage level shifted self-clocked intermediate true and complement signals (e.g., data_t_l_lvs 205a and data_c_l_lvs 205b) in a second voltage domain (e.g., vddar 240) from the self-clocked true and complement data input signals in the first voltage domain, using first and second full voltage level shifters (e.g., 220a and 220b)—Block 304; and generating voltage level shifted self-clocked tristated true and complement output signals (e.g., wbl_l_vddar 210b and wbl_vddar 210a) in the second voltage domain from the voltage level shifted self-clocked intermediate true and complements signals, using first and second complementary metal oxide semiconductor (CMOS) circuits (e.g., 207a and 207b)—Block 306.

Figure 4:
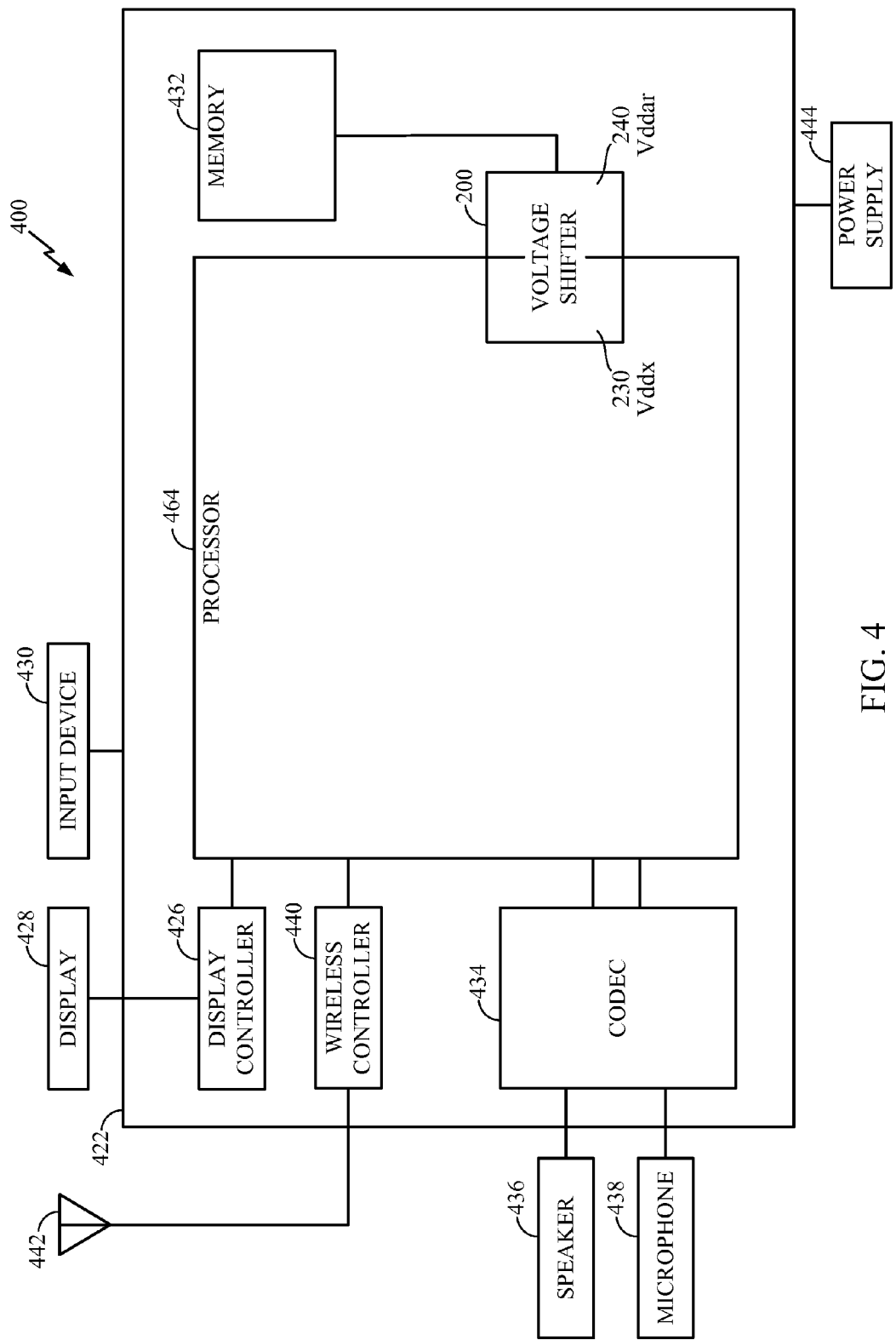
FIG. 4 illustrates an exemplary wireless device 400 in which an aspect of the disclosure may be advantageously employed.

Referring now to FIG. 4, a block diagram of a particular illustrative embodiment of a wireless device that includes a self-clocked write bitline driver configured according to exemplary aspects is depicted and generally designated 400. Wireless device 400 includes processor 464 coupled to memory 432. Wireless device 400 is also shown to include exemplary circuit 200 illustrated in FIG. 2A, where circuit 200 may provide voltage shifting of differential data signals provided by processor 464 in a first voltage domain vddx 230, to self-clocked differential write bitline driver output signals in a second voltage domain vddar 240. One or more arrays of bit cells in memory 432 may be configured in a voltage island corresponding to the second voltage domain vddar 240. Circuit 200 is shown to representatively straddle the two voltage domains 230 and 240 in FIG. 4, but it will be understood that this is merely for schematically representing aspects of this disclosure and not to be construed as a limitation in the placement/routing of hardware blocks pertaining to circuit 200.

FIG. 4 also shows display controller 426 that is coupled to processor 464 and to display 428. Coder/decoder (CODEC) 434 (e.g., an audio and/or voice CODEC) can be coupled to processor 464. Other components, such as wireless controller 440 (which may include a modem) are also illustrated. Speaker 436 and microphone 438 can be coupled to CODEC 434. FIG. 4 also indicates that wireless controller 440 can be coupled to wireless antenna 442. In a particular embodiment, processor 464, display controller 426, memory 432, CODEC 434, and wireless controller 440 are included in a system-in-package or system-on-chip device 422.

In a particular embodiment, input device 430 and power supply 444 are coupled to the system-on-chip device 422. Moreover, in a particular embodiment, as illustrated in FIG. 4, display 428, input device 430, speaker 436, microphone 438, wireless antenna 442, and power supply 444 are external to the system-on-chip device 422. However, each of display 428, input device 430, speaker 436, microphone 438, wireless antenna 442, and power supply 444 can be coupled to a component of the system-on-chip device 422, such as an interface or a controller.

It should be noted that although FIG. 4 depicts a wireless communications device, processor 464, and memory 432 may also be integrated into a set-top box, a music player, a video player, an entertainment unit, a navigation device, a personal digital assistant (PDA), a fixed location data unit, a mobile phone, a smart phone, or a computer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for operating a multiprocessing system with disunited private-information and shared-information caches. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
   first and second full voltage level shifters configured to receive self-clocked true and complement data input signals in a first voltage domain and generate voltage level shifted self-clocked intermediate true and complement signals in a second voltage domain, based on the self-clocked true and complement data input signals in the first voltage domain; and
   first and second complementary metal oxide semiconductor (CMOS) circuits configured to generate voltage level shifted self-clocked tristated true and complement output signals in the second voltage domain based on the voltage level shifted self-clocked intermediate true and complement signals.

2. The apparatus of claim 1 coupled to a memory array in the second voltage domain.

3. The apparatus of claim 2, wherein the voltage level shifted self-clocked tristated true and complement output signals in the second voltage domain are configured to drive write bitlines for writing memory bit cells in the memory array in the second voltage domain.

4. The apparatus of claim 1, further comprising a clamp circuit in the second voltage domain, configured to clamp the voltage level shifted self-clocked intermediate true and complement signals in the second voltage domain based on a collapse of the first voltage domain and in response to a clamp signal.

5. The apparatus of claim 4, wherein the first and second CMOS circuits are configured to float the voltage level shifted self-clocked tristated true and complement output signals in the second voltage domain when the voltage level shifted self-clocked intermediate true and complement signals in the second voltage domain are clamped.

6. The apparatus of claim 1, wherein the self-clocked true and complement data input signals are based on an data input signal and a system clock.

7. The apparatus of claim 1, wherein the self-clocked true and complement data input signals are generated from an entry latch or a clock gating latch.

8. The apparatus of claim 1, wherein the self-clocked true and complement data input signals are return-to-zero (RTZ) or self-resetting signals.

9. The apparatus of claim 1, integrated in a device selected from the group consisting of a set top box, music player, video player, entertainment unit, navigation device, communications device, personal digital assistant (PDA), fixed location data unit, mobile phone, and a computer.

10. A method of operating a circuit, the method comprising
    inputting self-clocked true and complement data input signals to the circuit in a first voltage domain;
    generating voltage level shifted self-clocked intermediate true and complement signals in a second voltage domain from the self-clocked true and complement data input signals in the first voltage domain, using first and second full voltage level shifters; and
    generating voltage level shifted self-clocked tristated true and complement output signals in the second voltage domain from the voltage level shifted self-clocked intermediate true and complement signals, using first and second complementary metal oxide semiconductor (CMOS) circuits.

11. The method of claim 10, further comprising providing the voltage level shifted self-clocked tristated true and complement output signals in the second voltage domain to drive write bitlines for writing memory bit cells in a memory array in the second voltage domain.

12. The method of claim 10, further comprising clamping the voltage level shifted self-clocked intermediate true and complement signals in the second voltage domain based on a collapse of the first voltage domain and in response to a clamp signal.

13. The method of claim 12, further comprising floating the voltage level shifted self-clocked tristated true and complement output signals in the second voltage domain when the voltage level shifted self-clocked intermediate true and complement signals in the second voltage domain are clamped.

14. The method of claim 10, further comprising generating the self-clocked true and complement data input signals based on a data input signal and a system clock.

15. The method of claim 10, further comprising generating the self-clocked true and complement data input signals using an entry latch or a clock gating latch.

16. The method of claim 10, wherein the self-clocked true and complement data input signals are return-to-zero (RTZ) or self-resetting signals.

17. A system comprising:
    first means for voltage level shifting and second means for voltage level shifting for receiving self-clocked true and complement data input signals in a first voltage domain and generating voltage level shifted self-clocked intermediate true and complement signals in a second voltage domain from the self-clocked true and complement data input signals in the first voltage domain; and
    means for tristating, for generating voltage level shifted self-clocked tristated true and complement output signals in the second voltage domain from the voltage level shifted self-clocked intermediate true and complement signals.

18. The system of claim 17, further comprising means for clamping the voltage level shifted self-clocked intermediate true and complement signals in the second voltage domain based on a collapse of the first voltage domain and in response to a clamp signal.

19. The system of claim 17, further comprising means for generating the self-clocked true and complement data input signals from a data input signal and a system clock.

* * * * *